United States Patent [19]

Ohuchi et al.

[11] 3,886,579

[45] May 27, 1975

[54] AVALANCHE PHOTODIODE

[75] Inventors: Hirobumi Ohuchi; Tatsuya Kamei; Kiyoshi Tsukuda; Takuzo Ogawa, all of Hitachi, Japan

[73] Assignee: Hitachi, Ltd., Japan

[22] Filed: July 24, 1973

[21] Appl. No.: 382,188

[30] Foreign Application Priority Data

July 28, 1972 Japan ........ 47-75095
Sept. 20, 1972 Japan ........ 47-93624

[52] U.S. Cl. ........ 357/13; 357/30; 357/58; 357/89; 357/90

[51] Int. Cl. ........ H01l 29/90; H01l 9/00

[58] Field of Search ..... 317/235 N, 235 T, 235 AD, 317/235 AM, 235 AN

[56] References Cited

UNITED STATES PATENTS

| | | | |
|---|---|---|---|
| 3,483,441 | 12/1969 | Hofflinger | 317/234 |
| 3,534,231 | 10/1970 | Biard | 317/235 |
| 3,539,883 | 11/1970 | Harrison | 317/234 |

*Primary Examiner*—Martin H. Edlow
*Attorney, Agent, or Firm*—Craig & Antonelli

[57] ABSTRACT

A photodiode comprises a four-layer hyperabrupt junction semiconductor having $p^+n\nu n^+$ or $n^+p\pi p^+$ structure and a guard ring of p or n type layer, enclosing the p-n junction defined in the $p^+n$ or $n^+p$ region of the $p^+n\nu n^+$ or $n^+p\pi p^+$ structure, wherein the bottom of the guard ring reaches the $\nu$ or $\pi$ region. By the use of the hyperabrupt junction the breakdown voltage can be comparatively small without causing any degradation in the response to the incident light and moreover a stable avalanche breakdown characteristic can be obtained with the thus formed guard ring. An avalanche photodiode having excellent characteristics inclusive of high photosensitivity can be fabricated by appropriately determining the concentration of the impurity and the thickness in the respective regions, directly affecting the avalanche characteristic. According to the present invention, it is disclosed that an avalanche photodiode having excellent characteristics can be obtained by forming through epitaxial growth of the respective regions affecting the avalanche characteristics.

10 Claims, 7 Drawing Figures

Patented May 27, 1975 3,886,579

4 Sheets-Sheet 1

AVALANCHE PHOTODIODE

BACKGROUND OF THE INVENTION

1. Field of the Invention

The present invention relates to an avalanche photodiode which has a stable avalanche characteristic and can be operated by a low voltage source and more particularly to an avalanche photodiode which has a high quantum efficiency for broad wavelength spectra and a high speed response characteristic.

2. Description of the Prior Art

The appearance of lasers has caused considerable interest in the field of optical application. Recently, the success in causing a semiconductor laser to continuously oscillate and the improvements on electronic materials have produced possibilities of developing optical devices. Above all, the interests of the world's engineers and researchers are centered on the systematic study of optical communications which may be claimed as an organic unity of materials and techniques. In such an optical communications system, a light detector used as a receiver to receive light signals must have a high sensitivity, a high response speed and a stable operation characteristic.

As a light detector there have been conventionally used a phototube and a photomultiplier tube which utilize the external photoelectric effect; a PdS cell and a CdS cell which operate on the basis of the photoconductive effect; a photodiode (hereafter referred to as PD for brevity), a phototransistor (hereafter referred to as PT), an avalanche photodiode (hereafter referred to as APD) and a solar cell which uses the photovoltaic effect; or a thermopile and a bolometer using the thermo-electric effect. For the purpose of processing optical information the photomultiplier tube, the PD, the PT and the APD are most suitable from the standpoint of sensitivity and response characteristic.

However, the PT has such a structure that it is not adapted for a high speed response operation. Although the response speed of the PD can be improved by employing a p-i-n structure, the PD, which does not have the function of an amplifier, must be combined in an application with an amplifier. In this case, the noise created in the amplifier adversely affects the output of the PD combined with the amplifier so that the signal-to-noise ratio will be reduced. The photomultiplier tube has a high response speed and a great multiplication factor, but the quantum efficiency of the tube is small and the operational voltage is considerably high, and it is very fragile so that it cannot be reduced in size.

On the other hand, the APD has a high response speed, the function of an amplifier, a high quantum efficiency and a comparatively low operational voltage and, moreover, it is a solid-state element so that it is mechanically strong. The APD has, however, a great technical difficulty in the fabricating process and this has prevented the fabrication of an element having satisfactory characteristics. Therefore, the application of the APD is still at an experimental stage. The main cause is that if an element such as GaAs having a high quantum efficiency and a high response speed for the near-infrared range is obtained by the use of a p-n junction, the breakdown voltage is very high so that one of the merits attributable to the solid-state element is cancelled.

An APD having a $p^+n\nu n^+$ or $n^+p\pi p^+$ structure (where $p^+$ designates a region in which p-type impurities are contained in high concentration, $n^+$ a region in which n-type impurities are contained in high concentration, $\nu$ a region which contains n-type impurities in low concentration and $\pi$ a region which contains p-type impurities in low concentration) has already been proposed and the operational characteristic of such a structure are now under investigation. However, no concrete structure which has a practical avalanche characteristic has yet been reported.

SUMMARY OF THE INVENTION

One object of the present invention is to provide an APD having a high sensitivity and a high response speed.

Another object of the present invention is to provide an APD having a high quantum efficiency and a low operational voltage.

An additional object of the present invention is to provide an APD having a high light-receiving sensitivity to a broad wavelength spectrum.

In order to attain the above mentioned objects, according to the present invention, a hyperabrupt junction having a controlled $p^+n\nu n^+$ or $n^+p\pi p^+$ structure is used and furnished with a suitable guard ring.

The above and other objects and features of the present invention will be apparent when the following description of the specification is read with the aid of the attached drawings.

DESCRIPTION OF THE PREFERRED EMBODIMENT

The hyperabrupt junction used in the present invention will be described with reference to FIG. 1*a* and FIG. 1*b*. The $p^+n\nu n^+$ structure shown in FIG. 1*a* comprises a $p^+$ region containing highly concentrated p-type impurities, an adjacent n region having the opposite conductivity type, a $\nu$ region containing n-type impurities of low concentration, and an $n^+$ region containing highly concentrated n-type impurities, to provide an ohmic contact. In the process of fabricating such a structure, for example, through the method of diffusing impurities, an $n^+$ layer is formed through diffusion of impurities on one surface of a semiconductor substrate of $\nu$-type while an n layer is formed on the opposite surface of the substrate. Next, a $p^+$ layer is formed by diffusing p-type impurities in the n layer. The inventors have also examined the fabrication of such a hyperabrupt junction through epitaxial growth and succeeded in producing a hyperabrupt junction having an excellent response to light without any drawbacks, by epitaxially growing a $\nu$ layer, an n layer and a $p^+$ layer successively on an $n^+$-type semiconductor substrate or by epitaxially growing a $\nu$ layer and an n layer on an $n^+$-type semiconductor substrate and forming a $p^+$ layer in the n layer.

Figure 1A:
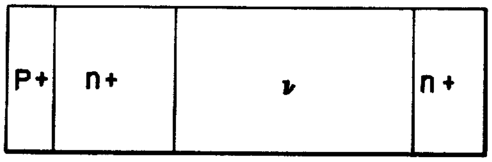
FIG. 1*a* illustrates a hyperabrupt junction structure.
Figure 1B:
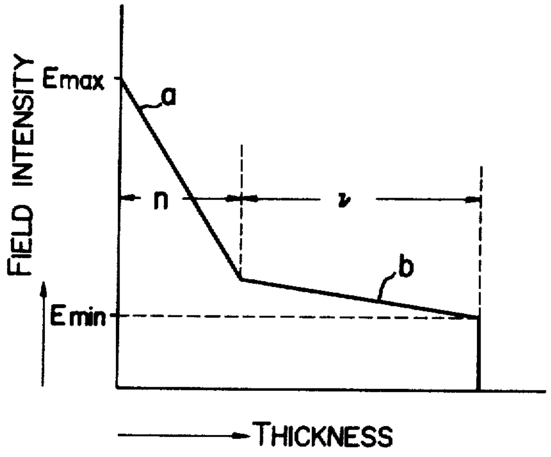
FIG. 1*b* shows in graphical representation the relationship between the thicknesses of the n and $\nu$ layers of the structure shown in FIG. 1*a* and the strength of the electric field applied to inversely bias the p-n junction of the structure in FIG. 1*a*.

Now, when a voltage high enough to inversely bias the $p^+$-n junction in the semiconductor body shown in FIG. 1*a* is applied to the body, the distribution of the electric field in the n or $\nu$ layer is as shown in FIG. 1*b*. In this case, the depletion layer occupies both the n and $\nu$ layers. Since the breakdown voltage of the APD is given by the integration under the curve in FIG. 1*b* representing the distribution of the electric field, it is necessary to minimize the area enclosed by straight lines representing the field intensity $E_{max}$ in that side of the n layer which is near the $p^+$ layer, the field intensity $E_{min}$ in that side of the $\nu$ layer which is near the $n^+$ layer, the gradient $a$ of the field intensity of the n layer determined by the impurity concentration of the n layer, and the gradient $b$ of the field intensity of the $\nu$ layer determined by the impurity of the $\nu$ layer. In a $p^+nn^+$ junction which is designed to produce a depletion region having the same width as described above, the breakdown voltage is by far higher than that of the $p^+n\nu n^+$ structure. It is, therefore, concluded that the proposed structure having a $\nu$ layer is a very preferable one in order to lower the breakdown voltage while maintaining the property as a light-receiving element.

If the field intensity $E_{min}$ in that side of the $\nu$ layer which is near the $n^+$ layer, in FIG. 1*b*, is equal to the minimum value of $1 \times 10^4$ V/cm which is required to attain a drift saturation velocity of carriers, an effective light-absorption region extends into both the n and the $\nu$ layers so that an APD having a high response speed and a high quantum efficiency for a broad wavelength spectrum can be obtained. Namely, if the above described requirements are fulfilled, the response speed can be increased since carriers created through excitation by light can be transferred to the avalanche region of the n layer at the drift saturation velocity.

It is understood from the foregoing description that the following items are essential for the fabrication of an APD made of silicon:

1. to determine the quantum efficiency and the response speed,
2. to determine the area of receiving light on the basis of the condition for use and the response speed,
3. to determine the effective light-absorption region (internal quantum efficiency) and to determine the sum of the thicknesses of the $\nu$ and n layers; the total thickness of about 20 $\mu$ is needed to produce an element having a quantum efficiency more than 50 percent for a wavelength of 9000 A,
4. to determine the gradients $a$ and $b$ which are considered in case of reducing the operational (breakdown) voltage, namely to determine the concentrations of impurities in the n and $\nu$ layers; experiments teach that impurity concentrations of the order of $5 \times 10^{15}$ $cm^{-3}$ and $1 \times 10^{14}$ $cm^{-3}$ are preferable respectively for the n and $\nu$ layers, and
5. to determine the thickness of the n or $\nu$ layer on the basis of $a$, $b$ and $E_{min}$; the deviation of $E_{min}$ within $7 \times 10^3$ to $4 \times 10^4$ V/cm is tolerable; the thicknesses of the n and $\nu$ layers are respectively $4.5\mu$ and $15.5\mu$ if the impurity concentration in the n layer is $5 \times 10^{15}$ $cm^{-3}$ and the $p^+$ layer adjacent to the n layer preferably has a thickness of $0.5$–$1\mu$ and an impurity concentration of $10^{19}$–$10^{20}$ $cm^{-3}$, as seen from the standpoint of the effective utilization factor for incident light.

As described above, the thicknesses of and the concentrations in the $p^+$, n and $\nu$ layers are appropriately determined. In order for the $p^+n$ junction to have a stable avalanche breakdown characteristic, it is necessary to prevent the low voltage breakdown in the exposed portion of the junction. For this reason, there is a need for a guard ring. The structure of the guard ring affects the characteristic of an avalanche diode to a great extent and therefore it is also the object of the present invention to provide a suitable configuration of a guard ring.

As is well known, the guard ring is provided to cover the end portion of the $p^+n$ junction and serves to prevent the exposure of the junction end where there is a high intensity electric field. Accordingly, the exposed surface of a $p^+n$ junction is changed to an edge surface of a pn junction and, therefore, the distribution of the field intensity in the $p^+n$ junction is moderated so that the surface breakdown can be prevented. The region forming the guard ring also establishes p-n junctions respectively with the n (or p) layer and the $\nu$ (or $\pi$) layer and these p-n junctions have a breakdown voltage higher than the $p^+n$ junction.

Figure 2:
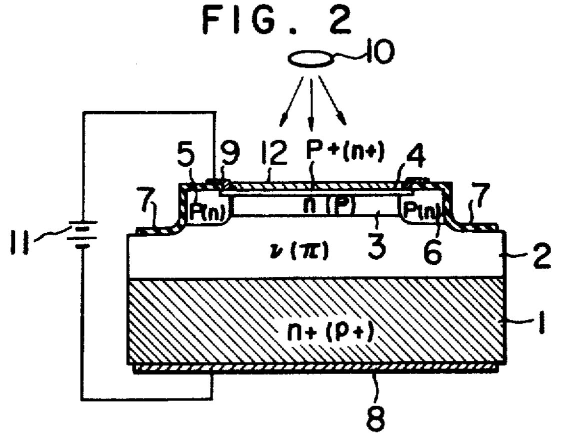
FIGS. 2 and 3 show in cross section APD's according to the present invention.
Figure 3:
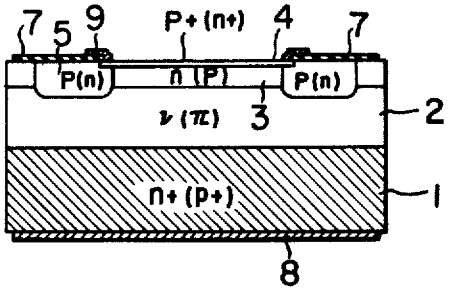
Figure 6:
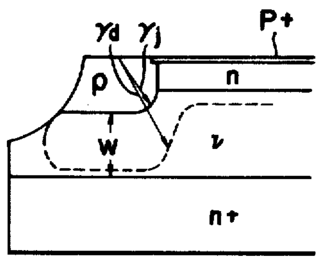
FIG. 6 illustrates the guard ring used in the APD according to the present invention.

The configuration of a guard ring for use in an avalanche photodiode having a $p^+n\nu n^+$ structure is as shown in FIG. 2, FIG. 3 or FIG. 6. The guard ring is so formed as to lie deeper than the $p^+$ or n layer and to reach the $\nu$ layer. The depth of the guard ring has a great influence on the avalanche characteristic. A guard ring as shown in FIG. 6, with a depth of $r_j$ and an impurity concentration of Nb ($cm^{-3}$), has a breakdown voltage along the edge of the p layer, given by the following formula:

$$V_B = \frac{qNb}{2\epsilon}\left(\frac{r_d^2 - r_j^2}{2} - r_d^2 \ln \frac{r_d}{r_j}\right) \quad (1)$$

where $V_B$ is the breakdown voltage of a guard ring, $q$ the amount of electric charges, $\epsilon$ the dielectric constant and $r_d$ the spread of the depletion region.

It is preferable that the p-n junction should be designed to have a breakdown voltage higher by 50 percent than that of the $p^+n$ junction. For example, if the breakdown voltage of the $p^+n$ junction is 140 V, that of the guard ring will be preferably 200 V. It follows from the formula (1) that a depth of about $7\mu$ is sufficient for the guard ring. In the structure shown in FIG. 6, the junction between the p layer and the $\nu$ layer breaks down when $\alpha W = 1$, where $W$ is the thickness of the portion of the $\nu$ layer lying under the guard ring (p layer) and $\alpha$ is the ionization coefficient such that $\alpha = A \exp(-B/E)$, $A$ and $B$ being the constants proper to materials and $E$ the field intensity. The p-n junction does not breakdown if $E_B < E_{max}$ where $E_{max}$ is the maximum intensity of the field in the $\nu$ layer under the p layer (guard ring) having a thickness of W and $E_B$ is the field intensity developed by the rated operational voltage. The inequality is satisfied if $W = 13\mu$. Therefore, in order to fabricate an APD having a breakdown voltage of 140 V, it is necessary to make the sum of the thicknesses of the n and $\nu$ layers about 20$\mu$ thick and the bottom of the guard ring 7$\mu$ deep.

Next, embodiments of the present invention will be described with reference to FIGS. 2 and 3. FIG. 2 shows a mesa type APD and FIG. 3 a planar type one. Adjacent to an $n^+$-type semiconductor substrate 1 is formed an $\nu$ layer 2 containing impurities of low concentration having the same conductivity type. In addition, an n layer 3 having the same conductivity type is provided adjacent to the $\nu$ layer. The n layer 3 has an impurity concentration higher than the $\nu$ layer 2 and forms a $p^+n$ junction with a $p^+$ layer formed thereon, having the opposite conductivity type. Light is cast onto the $p^+$ layer and the light-excited carriers are avalanche-multiplied through the $p^+n$ junction. A guard ring 5 of a p-type layer is provided to cover the edge portion of the $p^+n$ junction, with its bottom reaching the $\nu$ layer 2. The surface impurity concentration of the guard ring is $10^{19}$–$10^{20}$ $cm^{-3}$.

In the mesa type APD the guard ring 5 is etched as shown in FIG. 2 while in the planar type APD the guard ring 5 is not etched as shown in FIG. 3. The light-receiving portion of the surface of the $p^+$ layer is coated with an anti-reflection film 12 such as SiO film to prevent the reflection loss of signal light while the remaining portion of the surface of the $p^+$ layer that does not receive the signal light is covered with an insulating film 7 such as $SiO_2$ or $Si_3N_4$ film.

A ring shaped electrode 9 is disposed on the $p^+$ layer and a sheet electrode 8 is provided on the $n^+$ layer. The electrodes 8 and 9 are connected between a power source 11 to inversely bias the $p^+n$ junction and the light-receiving surface is directed toward a light source 10. The light signal from the source 10 may be directly cast upon the light-receiving surface but may also be conducted through, for example, a well-known glass-fiber scope. The way of conducting the light signal to the light-receiving surface is not within the scope of the present invention. In FIG. 3 showing the planar type APD, only the semiconductor body and the electrodes are depicted for simplicity's sake, but in the actual application the constitution as shown in FIG. 2 must be employed.

As described above, the APD having the $p^+n\nu n^+$ or $n^+p\pi p^+$ structure according to the present invention has a high quantum efficiency and a high response speed and that with a comparatively low breakdown voltage. Moreover, according to the present invention, the $p^+n$ or $n^+p$ junction in which avalanche breakdown takes place is protected by the guard ring reaching the $\nu$ or $\pi$ layer so that the resulting avalanche breakdown characteristic is stable.

The APD according to the present invention can be fabricated only through the diffusion process. Namely, the $n^+$ (or $p^+$), n (or p), $p^+$ (or p) regions and the p (or n) region as the guard ring can be formed on the $\nu$- (or $\pi$-) type substrate through impurity diffusion. However, the inventors have found that it is not recommendable from the point of work efficiency and characteristic of the element to be completed to form all the regions through diffusion method. In the diffusion process, the semiconductor substrate of $\nu$- or $\pi$-type must have a thickness of about 150–200$\mu$ to maintain a sufficient mechanical strength. The $n^+$ or $p^+$ region having a thickness of 130–150$\mu$ must be formed in the $\nu$- or $\pi$-type substrate by diffusing impurties from one surface thereof to leave the $\nu$ or $\pi$ region having a thickness of 20 $\mu$. Therefore, a rather long time is spent before completion of diffusion. Also, with this method, it is difficult to control the impurity concentrations in the $p^+$ and n layers or in the $n^+$ and p layers and it is impossible to make the gradient of the impurity concentration in the $p^+n$ or $n^+p$ junction sufficiently stepwise. Accordingly, an APD having a good reproducibility cannot be obtained. This will be understood from the description of FIG. 1.

The inventors have proposed to form at least $n\nu$ or $p\pi$ superposition through epitaxial growth so as to solve the above problems. By doing so, an APD having an excellent characteristic can be fabricated.

A concrete description will be made below of forming an APD according to the present invention by the use of the epitaxial growth technique.

The semiconductor substrate used in this case may have the $n^+$- or $p^+$-type conductivity but for simplicity's sake only the semiconductor substrate having the $n^+$-type conductivity will be described. The suitable thickness of the $n^+$-type semiconductor substrate is within a range of 150 to 200$\mu$, to maintain a sufficient mechanical strength and in this case a silicon wafer having a thickness of 150$\mu$ and an impurity concentration of the order of $10^{19}$ $cm^{-3}$ is used. On this $n^+$-type silicon wafer is grown in gaseous phase an $\nu$ layer having a thickness of 15.5$\mu$ and an impurity concentration of the order of $10^{13}$ $cm^{-3}$. The vapor growth method itself is well known but the apparatus and the gas are cleaned enough to form a $\nu$ layer having a low impurity concentration.

Next, an n layer having a thickness of 5.0$\mu$ and having an impurity concentration of $5 \times 10^{15}$ $cm^{-3}$ is formed on the $\nu$ layer through vapor growth. The above mentioned thicknesses and impurity concentrations are determined by the wavelength of the incident light, the purpose of application, the quantum efficiency, the field intensity ($1 \times 10^4$ V/cm) in the $\nu$ layer adjacent to the $n^+$ layer, and the expected breakdown voltage (140 V).

Then, a guard ring having a thickness of 7.5$\mu$ is formed in the n layer by diffusing p-type impurities and thereafter a $p^+$ layer having a surface impurity concentration of $5 \times 10^{19}$ $cm^{-3}$ and a thickness of 0.5$\mu$ is formed on that portion of the n layer which is encircled by the guard ring, through diffusion of p-type impurities, to form a $p^+n$ junction. Here, the surface of the $p^+$ layer encircled within the guard ring serves as a light-receiving surface. If the $p^+$ layer is formed by diffusing gallium atoms, an APD having a small dark current can be obtained. If the $p^+$ layer is made too thin, the dark current increases due to surface recombination of carriers. If, on the other hand, the thickness of the $p^+$ layer is too large, the response characteristic is deteriorated since the too thick layer causes the light absorption loss and the carriers generated in the layer travel through diffusion effect up to the $p^+n$ junction.

After the predetermined junction and diffused layers have been formed as shown in FIG. 3, the circumferential portions of the guard ring and the wafer are etched away to form a mesa type semiconductor body as shown in FIG. 2. Finally, an insulating film 7 of $SiO_2$ and an anti-reflection film 12 of SiO are coated on appropriate portions of the exposed surface of the wafer and electrodes 8 and 9 are also attached to the wafer.

Figure 4:
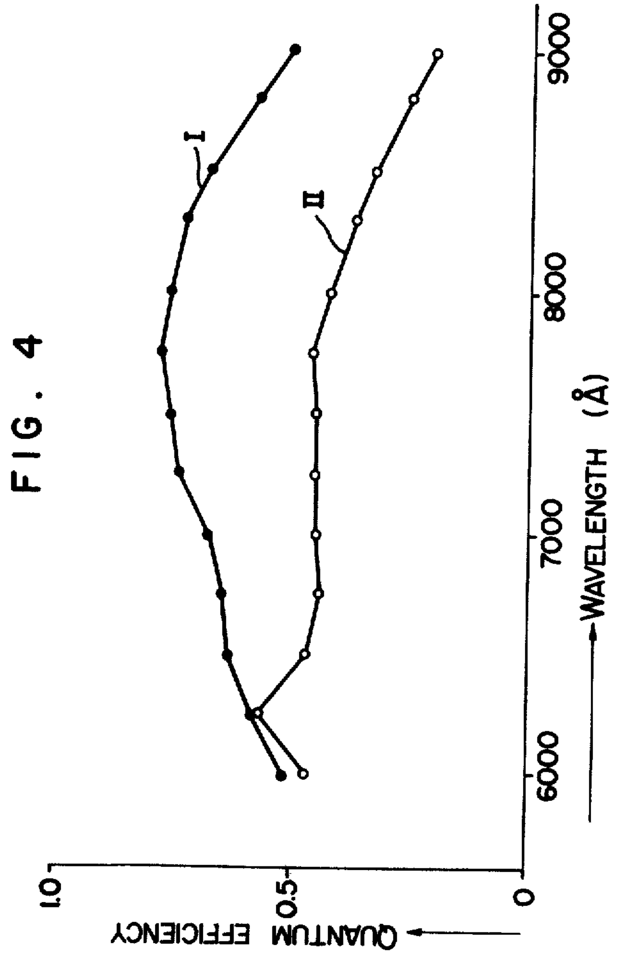
FIG. 4 shows in graphical representation the relationships between the wavelength of received light and the quantum efficiency, respectively for the APD according to the present invention and another one prepared for comparison.
Figure 5:
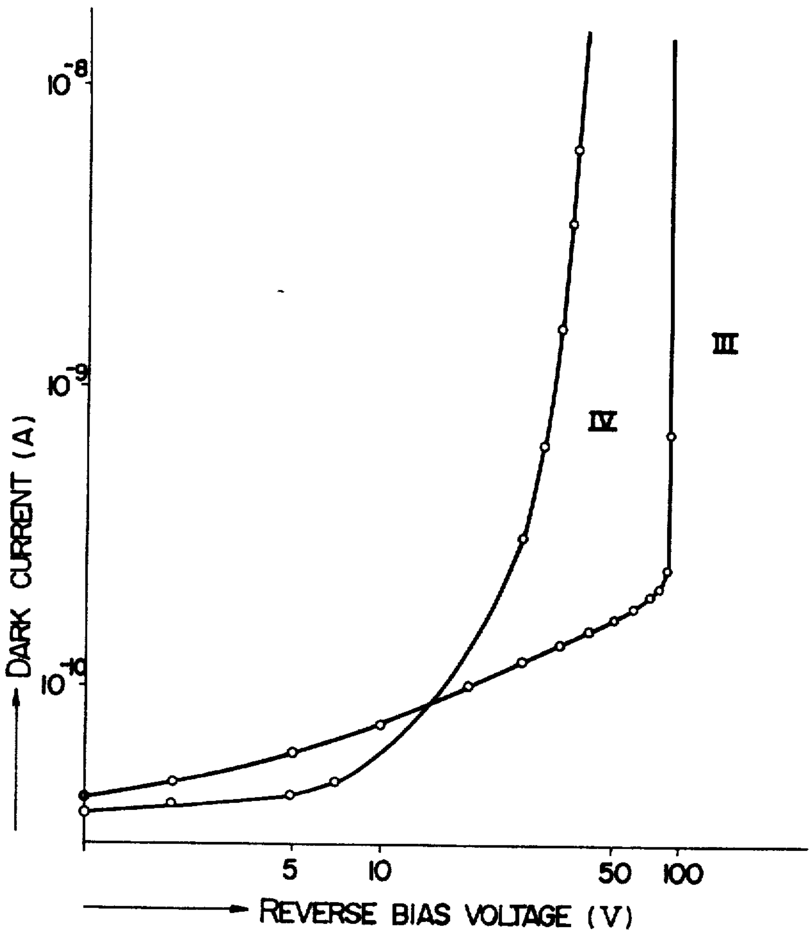
FIG. 5 shows in graphical representation the relationships between the reverse bias voltage and the dark current, respectively for the APD according to the present invention and another one prepared for comparison.

FIGS. 4 and 5 shows the comparison between the characteristics of the APD fabricated according to the present invention and those of an APD having a guard ring and a $p^+nn^+$ structure. In those figures, the curves I and III represent the characteristic of the APD of the present invention while the curves II and IV correspond to the APD having the $p^+nn^+$ structure with the guard ring. The operational voltage is 140 V in both cases.

As is known from FIG. 4, the APD of the present invention has a higher quantum efficiency for a broad wavelength spectrum than the APD having the $p^+nn^+$ structure with guard ring, and especially for long wavelengths, i.e. near 9000 A, so that the APD according to the present invention is most suitable as a light detector for the optical communications system using a GaAs light source which system is recently most hopeful.

Moreover, the measurement has revealed that the present APD has a response speed of $10^{-10}$ sec. which is equal to the response speed of the compared APD.

As is known from FIG. 5, the present APD has a dark current smaller than that of the compared APD. This is partly because the present APD has the $p^+$ layer formed through the diffusion of gallium atoms and partly because the guard ring is suitably shaped.

We claim:

1. An avalanche photodiode comprising:

a semiconductor body having first and second principal surfaces, which body comprises a first semiconductor region of a first conductivity type and a relatively high impurity concentration, one surface of which forms said first principal surface of said body;

a second semiconductor region of said first conductivity type and an impurity concentration lower than that of said first semiconductor region disposed on said first semiconductor region;

a third semiconductor region of said first conductivity type and having an impurity concentration lower than that of said first region and higher than that of said second region disposed on said second semiconductor region;

a fourth semiconductor region of a second conductivity type, opposite said first conductivity type, and having a relatively high impurity concentration, disposed on said third semiconductor region and defining a first PN junction therewith, the surface of said fourth semiconductor region opposite the surface thereof contacting said third semiconductor region forming said second principal surface of said body;

a fifth semiconductor region of said second conductivity type and having an impurity concentration lower than that of said fourth semiconductor region contacting and surrounding said third and fourth semiconductor regions and having a thickness extending from said second principal surface of said body to beyond the interface of said second and third semiconductor regions and defining a second PN junction with said second and third semiconductor regions, which second PN junction has a breakdown voltage higher than that of said first PN junction;

a first electrode disposed on said first principal surface of said semiconductor body; and a second annular-shaped electrode disposed on a peripheral portion of said fourth semiconductor region above said first PN junction, at the second principal surface of said semiconductor body thereby exposing said fourth semiconductor region to light;

and wherein the thickness of said second semiconductor region between said fifth and first semiconductor regions is larger than the spread of a depletion region within said second region, while the sum of the thickness of said second and third regions is such that said diode has a quantum efficiency exceeding 50 percent for the wavelength of the light which impinges on said diode.

2. An avalanche photodiode according to claim 1, wherein the depth $r_j$ of said fifth region from said second principal surface of said body satisfies the equation $$V_B = \frac{qNb}{2\epsilon}\left(\frac{r_d^2 - r_j^2}{2} - r_d^2 \ln\frac{r_d}{r_j}\right),$$

wherein $V_B$ is the breakdown voltage of said second PN junction, $q$ is the quantity of electric charge, $\epsilon$ is the dielectric constant and $r_d$ is the distance of the spread of said depletion region from said second principal surface.

3. An avalanche photodiode according to claim 1, wherein said fourth semiconductor region is doped with gallium atoms.

4. An avalanche photodiode according to claim 1, wherein each of said semiconductor body is made of silicon and the sum of the thicknesses of said second, third and fourth regions is within the range of from 20 to 21 $\mu$.

5. An avalanche photodiode according to claim 1, further including an anti-reflection film coated on said fourth semiconductor region.

6. An avalanche photodiode according to claim 1, further including means, coupled to said first and second electrodes, for applying a reverse bias voltage across said first PN junction.

7. An avalanche photodiode according to claim 1, wherein the thickness of said fifth semiconductor region is from 7 to 7.5 $\mu$ and the thickness of said fourth semiconductor region is 0.5 $\mu$.

8. An avalanche photodiode according to claim 7, wherein the thickness of said second semiconductor region between said fifth and first semiconductor regions is 13 $\mu$.

9. An avalanche photodiode according to claim 8, wherein the thickness of said second semiconductor region is 15.5 $\mu$.

10. An avalanche photodiode according to claim 9, wherein the impurity concentrations of said second and third semiconductor regions are $1 \times 10^{14}$ atoms/cm$^3$ and $5 \times 10^{15}$ atoms/cm$^3$, respectively.

* * * * *